United States Patent
Xu et al.

(10) Patent No.: US 8,327,532 B2
(45) Date of Patent: Dec. 11, 2012

(54) METHOD FOR RELEASING A MICROELECTRONIC ASSEMBLY FROM A CARRIER SUBSTRATE

(75) Inventors: Jianwen Xu, Chandler, AZ (US); Scott M. Hayes, Chandler, AZ (US); William H. Lytle, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 266 days.

(21) Appl. No.: 12/623,964

(22) Filed: Nov. 23, 2009

(65) Prior Publication Data
US 2011/0119910 A1     May 26, 2011

(51) Int. Cl.
*H05K 3/30* (2006.01)
(52) U.S. Cl. .......................... 29/841; 257/686
(58) Field of Classification Search ............... 29/841; 438/127, 106, 112, 118; 257/686
See application file for complete search history.

(56) References Cited

U.S. PATENT DOCUMENTS

| | | | | |
|---|---|---|---|---|
| 4,918,811 A * | 4/1990 | Eichelberger et al. | ......... | 438/107 |
| 5,032,543 A * | 7/1991 | Black et al. | ............... | 438/107 |
| 5,144,747 A * | 9/1992 | Eichelberger | .................... | 29/834 |
| 5,250,843 A * | 10/1993 | Eichelberger | .................... | 257/692 |
| 5,866,952 A * | 2/1999 | Wojnarowski et al. | ....... | 257/788 |
| 6,121,553 A * | 9/2000 | Shinada et al. | ............... | 174/259 |
| 6,159,767 A * | 12/2000 | Eichelberger | ................ | 438/107 |
| 6,274,821 B1 * | 8/2001 | Echigo et al. | ................ | 174/255 |
| 7,015,075 B2 * | 3/2006 | Fay et al. | ....................... | 438/127 |
| 7,029,949 B2 * | 4/2006 | Farnworth et al. | ............ | 438/113 |
| 7,247,523 B1 * | 7/2007 | Huemoeller et al. | ......... | 438/118 |
| 7,361,533 B1 * | 4/2008 | Huemoeller et al. | ......... | 438/123 |
| 7,420,272 B1 * | 9/2008 | Huemoeller et al. | ......... | 257/700 |
| 7,476,563 B2 * | 1/2009 | Mangrum et al. | ............ | 438/106 |
| 7,550,857 B1 * | 6/2009 | Longo et al. | .................. | 257/777 |
| 7,572,681 B1 * | 8/2009 | Huemoeller et al. | ......... | 438/125 |
| 7,588,951 B2 * | 9/2009 | Mangrum et al. | .............. | 438/25 |
| 7,633,765 B1 * | 12/2009 | Scanlan et al. | ................. | 361/760 |
| 7,655,502 B2 * | 2/2010 | Mangrum et al. | ............ | 438/106 |
| 7,671,457 B1 * | 3/2010 | Hiner et al. | .................... | 257/678 |
| 7,692,286 B1 * | 4/2010 | Huemoeller et al. | ......... | 257/700 |
| 7,696,016 B2 * | 4/2010 | Mangrum et al. | ............ | 438/127 |
| 7,714,431 B1 * | 5/2010 | Huemoeller et al. | ......... | 257/700 |
| 7,723,210 B2 * | 5/2010 | Berry et al. | .................... | 438/460 |
| 7,741,151 B2 * | 6/2010 | Amrine et al. | ................. | 438/107 |
| 7,802,359 B2 * | 9/2010 | Lytle et al. | ....................... | 29/830 |
| 7,807,511 B2 * | 10/2010 | Mangrum et al. | ............ | 438/127 |
| 2005/0158009 A1 * | 7/2005 | Eichelberger et al. | ........ | 385/147 |

FOREIGN PATENT DOCUMENTS

WO        0233751        4/2002

* cited by examiner

*Primary Examiner* — David Angwin
(74) *Attorney, Agent, or Firm* — Ingrassia Fisher & Lorenz, P.C.

(57) ABSTRACT

Methods for forming a microelectronic assembly (82) are provided. In one embodiment, the method includes providing a device substrate (50) having a plurality of electronic components (42) coupled thereto, and providing a carrier substrate (54) having first and second opposing surfaces (60, 62) and including a plurality of openings (58) extending between the first and second opposing surfaces (60, 62) and a plurality of depressions (64) formed on the first opposing surface (60). The method further includes attaching the device substrate (50) to the first opposing surface (60) of the carrier substrate (54) using an adhesive material (56) such that at least some of the adhesive material (56) is adjacent to at least some of the plurality of depressions (64), and removing the device substrate (50) from the carrier substrate (54).

18 Claims, 14 Drawing Sheets

METHOD FOR RELEASING A MICROELECTRONIC ASSEMBLY FROM A CARRIER SUBSTRATE

TECHNICAL FIELD

The present invention generally relates to a method and system for forming a microelectronic assembly, and more particularly relates to a method and system for accelerating the release of a microelectronic assembly from a carrier substrate.

BACKGROUND

Integrated circuits are formed on semiconductor substrates (or wafers). The wafers are then sawn into microelectronic die (or "dice"), or semiconductor chips, with each die carrying a respective integrated circuit. Conventionally, each semiconductor chip is connected to a package substrate using either wire bonding or "flip-chip" connections. The packaged chip is then typically mounted to a circuit board, or motherboard, before being installed in a system, such as an electronic or a computing system.

However, technologies have recently been developed which may reduce the need for conventional package substrates. One technology involves embedding the microelectronic die in substrates, or panels, and forming electrical connections from a "device" surface of the die to other portions of the panels. The panels are often formed by temporarily attaching the die to a support substrate and dispensing an epoxy over the die. After the epoxy is at least partially cured, the panel is removed from the support substrate.

To complete processing, the panel is then flipped to expose the microelectronic die and attached to another support substrate (e.g., a carrier substrate) using an adhesive such as a double-sided tape. The backend processing layers, such as dielectric layers, conductive traces, and contact formations (e.g., solder balls) are then formed on the panel over the exposed die. After backend processing, the panel is often removed from the carrier substrate by soaking the entire assembly in tub of solvents to at least partially dissolve the adhesive. A considerable amount of time may be required for the solvents to sufficiently and/or evenly dissolving the adhesive.

Accordingly, it is desirable to provide a method for forming microelectronic assemblies, such as those formed using an encapsulation process, which increases the speed at which the substrate in question may be removed from the carrier substrate and allows for the adhesive to be dissolved more evenly. Additionally, other desirable features and characteristics of the invention will become apparent from the subsequent detailed description and the appended claims, taken in conjunction with the accompanying drawings and the foregoing technical field and background.

BRIEF DESCRIPTION OF THE DRAWINGS

The various embodiments will hereinafter be described in conjunction with the following drawings, wherein like numerals denote like elements.

DETAILED DESCRIPTION

The following detailed description is merely exemplary in nature and is not intended to limit the application and uses of the various embodiments. Furthermore, there is no intention to be bound by any expressed or implied theory presented in the preceding technical field, background, and brief summary, or the following detailed description. It should also be noted that FIGS. 1-23 are merely illustrative and may not be drawn to scale.

FIG. 1 to FIG. 23 illustrate methods and systems for forming a microelectronic assembly. A device substrate (e.g., an epoxy panel) or a semiconductor wafer having a plurality of electronic components coupled thereto (e.g., embedded therein) is temporarily attached to a carrier substrate. The carrier substrate has first and second opposing surfaces, a plurality of openings extending between the first and second opposing surfaces, and a plurality of depressions formed on the first opposing surface. The device substrate is attached to the first opposing surface of the carrier substrate using an adhesive material such that at least some of the adhesive material is adjacent to at least some of the plurality of depressions. In one embodiment, after various processing steps, the device substrate is removed from the substrate by, for example, exposing the adhesive to a solvent. The depressions on the first surface of the carrier substrate decrease the contact area between the adhesive and the carrier substrate such that the time required to sufficiently dissolve the adhesive in order to remove the device substrate is reduced.

Figure 1:
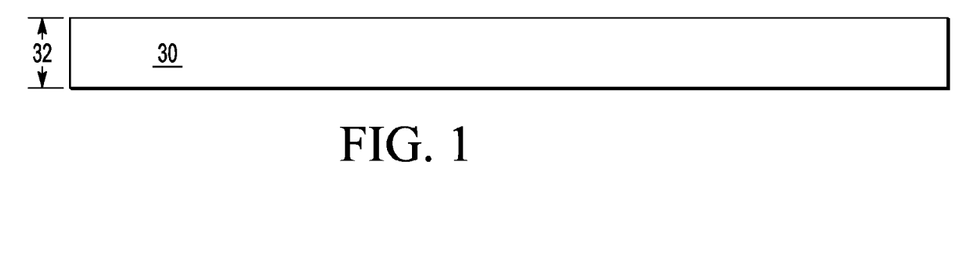
FIG. 1 is a cross-sectional side view of a support substrate.

Referring to FIG. 1, there is illustrated a support substrate 30. In one embodiment, the support substrate 30 is made of glass and has a thickness 32 of, for example, between 1.0 and 7.0 mm. The support substrate 30 may be, for example, circular, rectangular, or square in shape with a width (i.e., diameter or side length) of, for example, between 200 and 450 mm.

Figure 2:
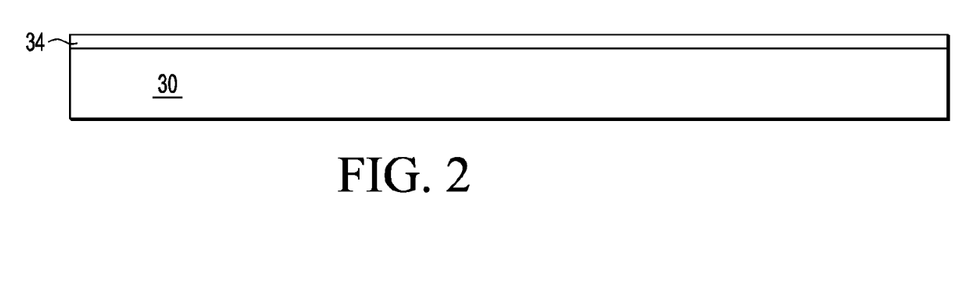
FIG. 2 is a cross-sectional side view of the support substrate of FIG. 1 with a release layer formed thereon.

As illustrated in FIG. 2, a release layer 34 is placed (or formed) on an upper surface of the support substrate 30. Although not specifically shown, in one embodiment, the release layer 34 includes a thermal release tape and a layer of thermally-degradable adhesive (i.e., a "sacrificial" adhesive) formed on the thermal release tape. The thermal release layer may be oriented on the support substrate 30 so that the thermally-degradable adhesive is between the support substrate 30 and the thermal release tape.

In another embodiment, the support substrate 30 is made of a porous material and the release layer 34 is a layer of solvent-soluble adhesive. The porous material may be one that allows a solvent to pass therethrough, such as a composite material of aluminum oxide embedded in a glass matrix. Other suitable materials include metals, ceramics, plastics, polymers, and combinations thereof. The solvent soluble adhesive may be a rosin-based thermoplastic adhesive. One example of such an adhesive is GENTAK 230, which is available from General Chemical of Parsippany, N.J., U.S.A., which may be coated onto the support substrate 30 by, for example, "spin-coating," as is commonly understood.

Figure 3:
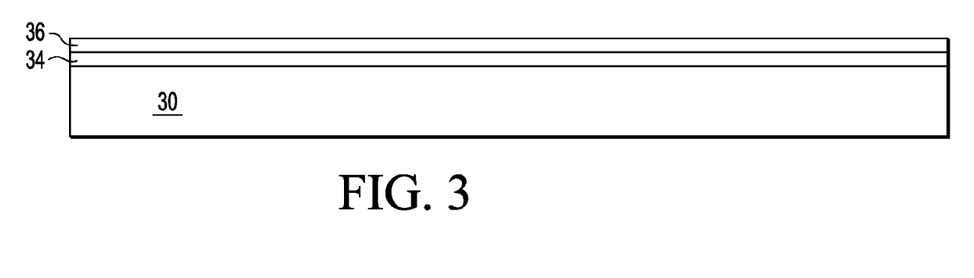
FIG. 3 is a cross-sectional side view of the support substrate of FIG. 2 with a polymeric layer formed over the release layer.

Referring to FIG. 3, a polymeric layer 36 is then formed over the release layer 34, which completely separates the polymeric layer 36 from the support substrate 30. Although not shown, in one embodiment, the polymeric layer 36 includes a polymeric tape and layers of polymeric adhesives on opposing sides of the polymeric tape. In one embodiment, the polymeric tape is made of polyimide and the polymeric adhesive is a silicone adhesive, respectively, as is commonly understood.

Figure 4:
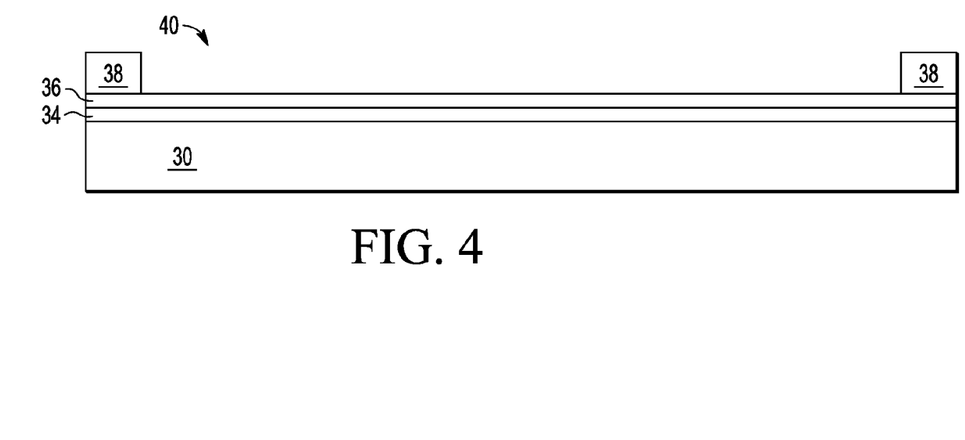
FIG. 4 is a cross-sectional side view of the support substrate of FIG. 3 with a mold frame positioned over the polymeric layer.
Figure 6:
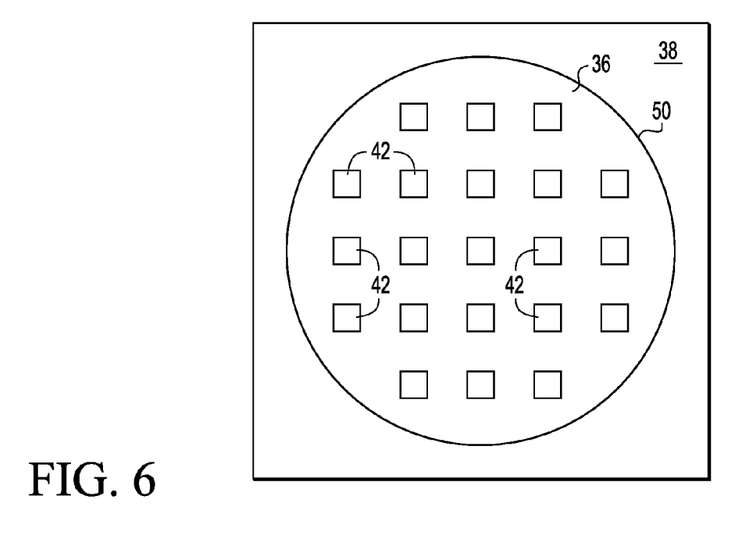
FIG. 6 is a top plan view of the support substrate of FIG. 5.

As shown in FIG. 4, a mold frame 38 is then placed over the polymeric layer 36. The mold frame 38 has an opening 40 at a central portion thereof that lies over a central, exposed portion of the support substrate 30. Although not shown, in one embodiment, an embedded ground plane composed of metal (e.g., copper) or composite with cavities for microelectronic die may be placed on the support substrate 30 inside the opening 40 of the mold frame 38. Referring ahead to FIG. 6, the opening 40 may be similar in size to the entire support substrate 30, as will be appreciated by one skilled in the art.

Figure 5:
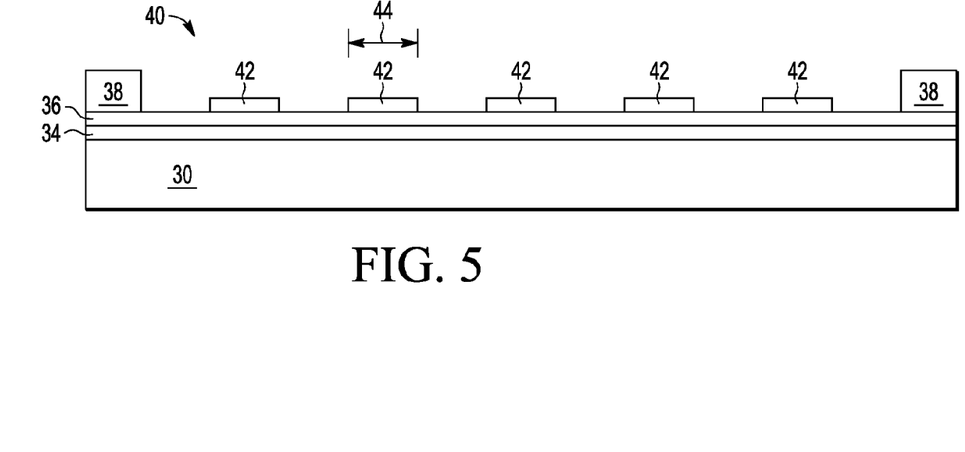
FIG. 5 is a cross-sectional side view of the support substrate of FIG. 4 with microelectronic die placed on the polymeric layer.

Referring to FIG. 5 in combination with FIG. 6, multiple microelectronic die (or electronic components) 42 are then placed within the opening 40 of the mold frame 38 and onto the polymeric layer 36. In one embodiment, each die 42 includes a substrate made of a semiconductor material, such as gallium arsenide (GaAs), gallium nitride (GaN), or silicon (Si) with an integrated circuit formed thereon (or therein), which include a plurality of semiconductor devices, such as transistors. In the depicted embodiment, the die 42 are substantially square (or rectangular) with a side length (or die width) 44 of, for example, between 0.5 and 20 mm and a thickness (not shown) of, for example, between 50 and 800 µm. Referring specifically to FIG. 6, the die 42 are evenly spaced within the opening 40 of the mold frame 38. As will be appreciated by one skilled in the art, in one embodiment, the placement of the die 42 may be controlled to account for physical changes in the various components of the assembly shown, such as expansion and/or compression due to variations in the coefficients of thermal expansion (CTE) of the various materials used.

Figure 7:
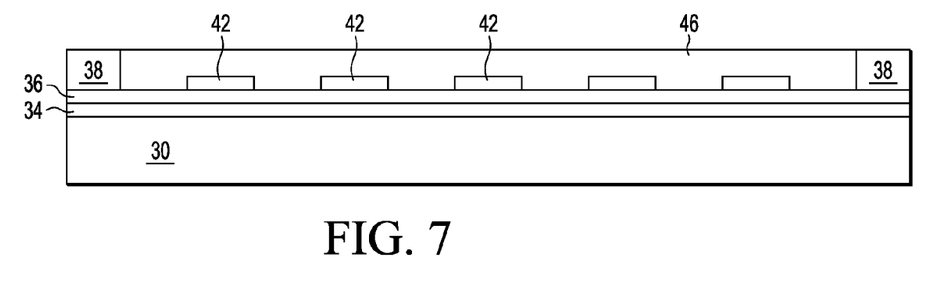
FIG. 7 is a cross-sectional side view of the support substrate of FIG. 5 with an encapsulation material deposited over the microelectronic die to form a device panel.

Next, as illustrated in FIG. 7, an encapsulation material 46 is deposited (or formed) over the microelectronic die 42 and on the exposed portions of the polymeric layer 36 within the opening 40 of the mold frame 38. Although not shown, the encapsulation material 46 may be deposited to have a depth (or thickness) of, for example, approximately 0.65 mm, which may be similar to a thickness of the mold frame 38 (as measured over the polymeric layer 36). In one embodiment, the encapsulation material is a silica-filled epoxy with a final cure temperature of, for example, between 140 and 150° C. and is printed or dispensed into the opening 40, as is commonly understood. Other embodiments may use other types of encapsulation materials and other processes to deposit the encapsulation material 46, such as screen printing, extrusion coating, transfer molding, ejection molding, and "glob top."

Figure 8:
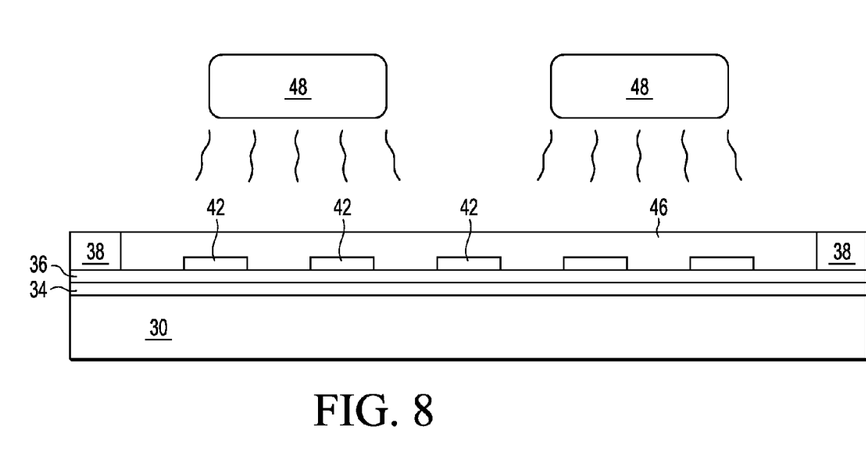
FIG. 8 is a cross-sectional side view of the support substrate of FIG. 7 undergoing a heating process.

As shown in FIG. 8, the support substrate 30, along with the various components formed thereon, are then heated or "baked" in, for example, an oven with heating elements 48, as is commonly understood. In one embodiment, the support substrate 30 is baked at approximately 100° C. (i.e., a partial cure temperature) for 60 minutes, which only partially cures (e.g., 80% cure) the encapsulation material 46. Additionally, in an embodiment in which the release layer 34 includes a thermally-degradable adhesive, the partial cure temperature is below the thermal breakdown temperature of the thermally-degradable adhesive such that a strong adhesive bond remains between the support substrate 30 and the thermal release tape after the heating process described above. However, in embodiments not utilizing the thermally-degradable adhesive, the baking process depicted in FIG. 8 may completely cure the encapsulation material 46.

Figure 9:
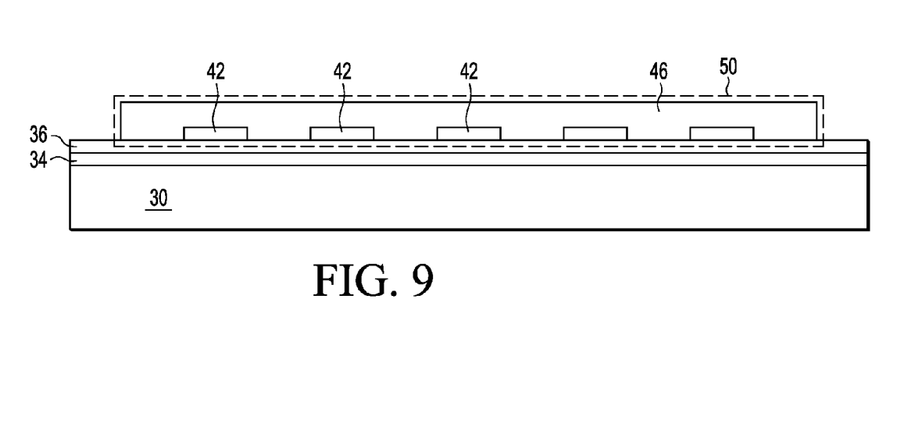
FIG. 9 is a cross-sectional side view of the support substrate after undergoing the heating process shown in FIG. 8 with the mold frame removed.
Figure 10:
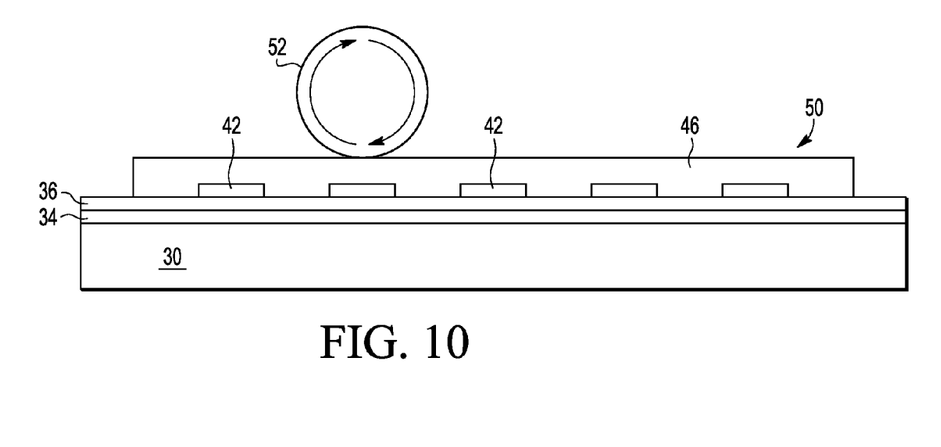
FIG. 10 is a cross-sectional side view of the support substrate of FIG. 9 illustrating the device panel undergoing a grinding process.

Referring to FIG. 9, the mold frame 38 is then removed. After the curing described above, the encapsulation material 46 becomes at least partially rigid and forms a device panel or substrate (or an encapsulated structure) 50. The device panel 50 has an initial thickness similar to the depth of the encapsulation material 46 and includes the microelectronic die 42 embedded therein. As illustrated in FIG. 10, an exposed surface of the device panel 50 then undergoes a grinding (and/or polishing and/or abrasion) process to reduce the thickness of the device panel 50 to a reduced, or "thinned," thickness (e.g., 0.75 mm). In the depicted embodiment, the grinding process is performed using a polishing or grinding head (or polishing element) 52 that is placed into contact with and pressed against the device panel 50 while being rotated and moved across the exposed surface of the device panel 50.

Figure 11:
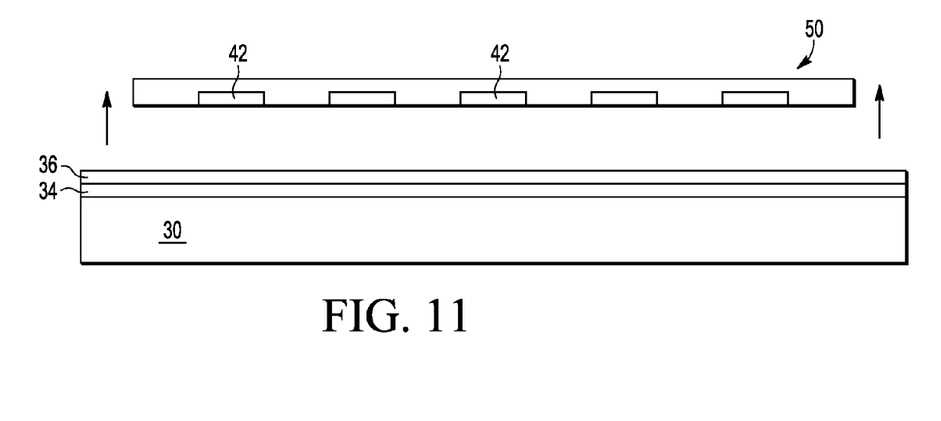
FIG. 11 is a cross-sectional side view of the support substrate of FIG. 10 illustrating the device panel, along with the microelectronic die, being separated from the polymeric layer.

In the embodiment in which the release layer 34 includes a thermally-degradable adhesive, the support substrate 30 may then undergo one or more subsequent heating processes at temperatures greater than or equal to the breakdown temperature of the thermally-degradable adhesive. In the embodiment in which the solvent soluble adhesive is used, the support substrate 30 is then soaked in the particular solvent in which the adhesive dissolves for a duration of, for example, between 30 and 120 minutes. The solvent degrades the adhesive to a point such that the polymeric layer 36 may be easily removed. Referring to FIG. 11, the device panel 50 is then removed from the support substrate 30.

Figure 12:
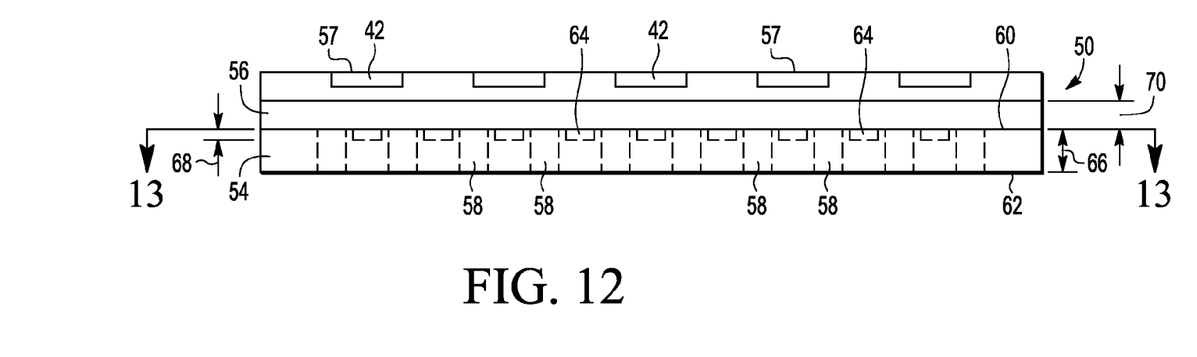
FIG. 12 is a cross-sectional side view of a carrier substrate with the device panel of FIG. 11 attached thereto.
Figure 13:
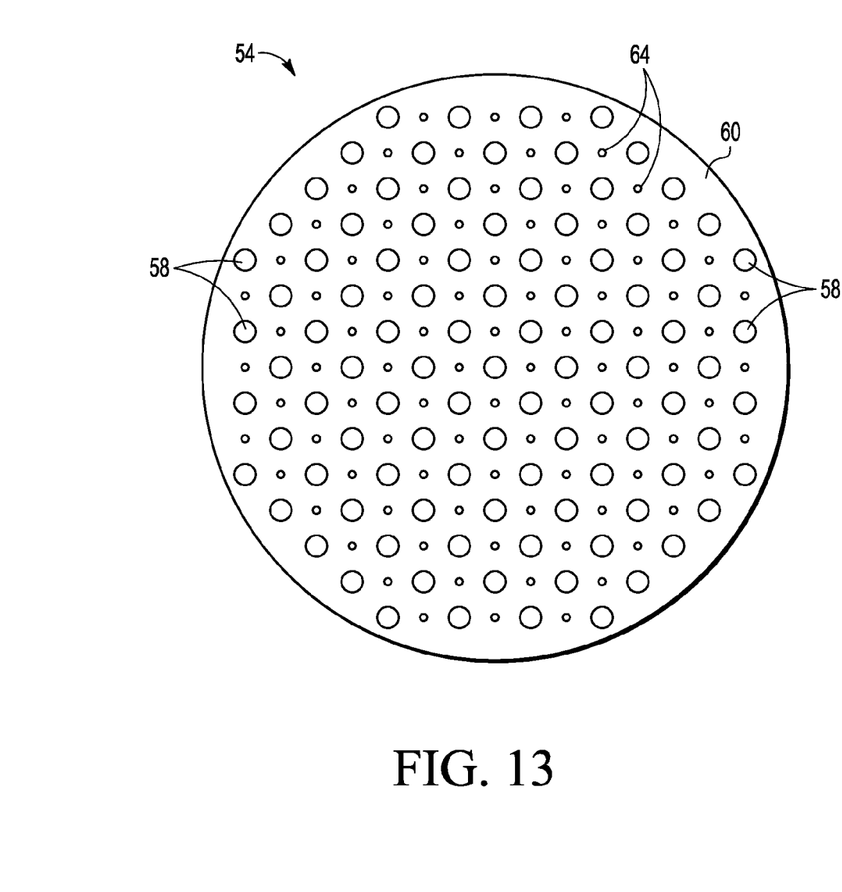
FIG. 13 is a plan view of the carrier substrate of FIG. 12 as seen along line 13-13 in FIG. 12.

As shown in FIG. 12, the device panel 50 is then attached to a carrier substrate 54 with an adhesive layer (or material) 56. As indicated, the device panel 50 may be flipped such that device surfaces 57 of the microelectronic die 42 are exposed at what is now an upper surface of the device panel 50. The carrier substrate 54 is, in one embodiment, made substantially of a disc-shaped main body (also indicated by reference numeral 54) made of a ceramic material that has a plurality of openings 58 therethrough, which extend to opposing first and second sides (or surfaces) 60 and 62 thereof. Referring to FIGS. 12 and 13, the carrier substrate also includes a plurality of depressions 64 formed on the first surface 60. As shown, the carrier substrate 54 has a width similar to (i.e., substantially greater than or equal to) the diameter of the device panel 50 to provide support for the entire device panel 50 and a thickness 66 of, for example, approximately 1 mm.

In the depicted embodiment, the openings 58 are circular and have a diameter of, for example, approximately 1.25 mm. Although not specifically shown, the openings 58 may be separated by a distance of, for example, approximately 4.24 mm (as measured from center to center of adjacent openings 68). The depressions 64 may also be circular in shape with a diameter of, for example, approximately 1 mm and a depth 68 of, for example, approximately 100 μm, which is considerably less than the thickness 66 of the carrier substrate 54. As shown in FIG. 13, the depressions 64 may be evenly arranged between the openings 58 such that each of the depressions is positioned between a respective pair of the openings 58.

In one embodiment, the adhesive layer 56 is a double-sided polymeric tape with a solvent-soluble adhesive, as is commonly understood, on both sides. The adhesive layer 56 may have a thickness 70 of, for example, between 25 and 75 μm, which is less than the depth 68 of the depressions 64. Of particular interest is that the depressions 64 form gaps between the adhesive layer 56 and the carrier substrate 54, thus reducing the surface area of the carrier substrate 54 in contact with the adhesive layer 56, and vice versa. In other embodiments, the adhesive layer 56 is a transfer adhesive with no internal substrate, such as a tape.

Figure 14:
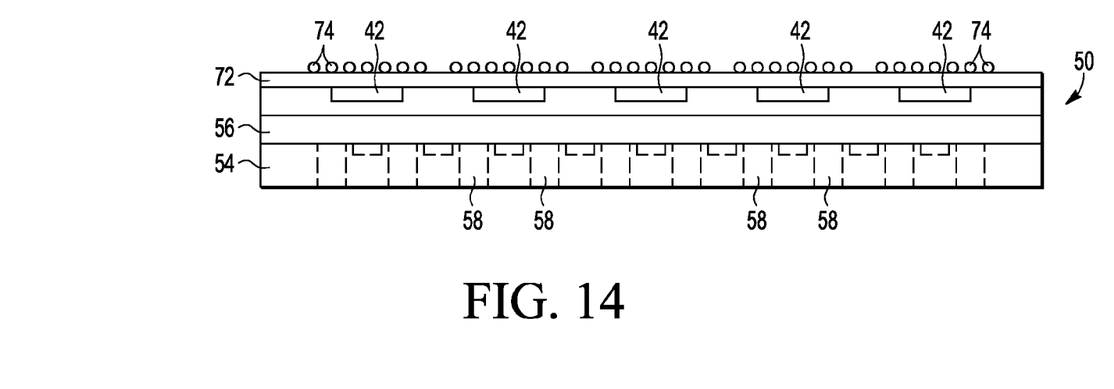
FIG. 14 is a cross-sectional side view of the carrier substrate of FIG. 12 with a build-up layer and contact formations formed on the device panel.
Figure 19:
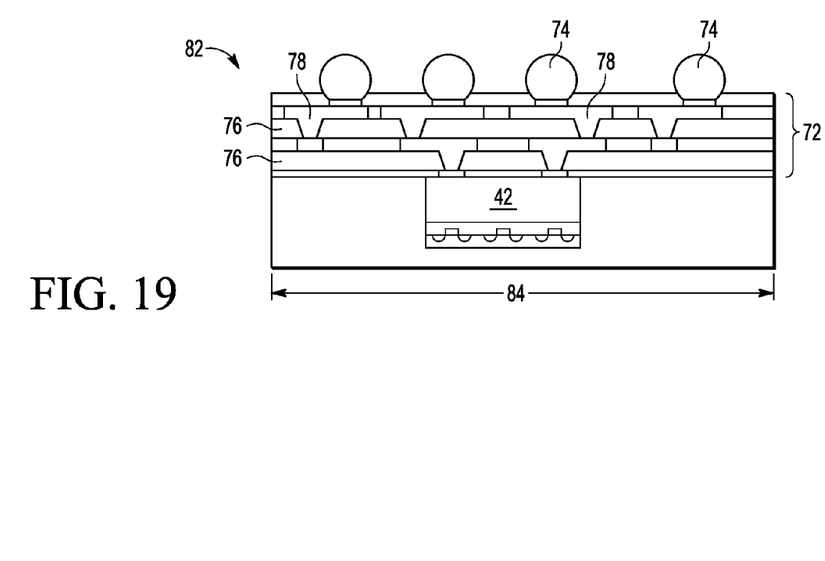
FIG. 19 is a cross-sectional side view of one of the integrated circuit packages of FIG. 17.

Referring to FIGS. 14 and 19, a build-up (or backend) layer 72 and contact formations 74 are then formed on the exposed side of the device panel 50. As is commonly understood, the build-up layer 72 includes a plurality of insulating (i.e., dielectric) layers 76 and conductors 78 (e.g., traces and vias), which may be formed using standard wafer level packaging processing steps, as are commonly understood. The contact formations 74, in the depicted embodiment, are conductive solder balls, which may be formed using known techniques. Each of the contact formations 74 is electrically connected to the integrated circuit within one of the microelectronic die 42.

Figure 15:
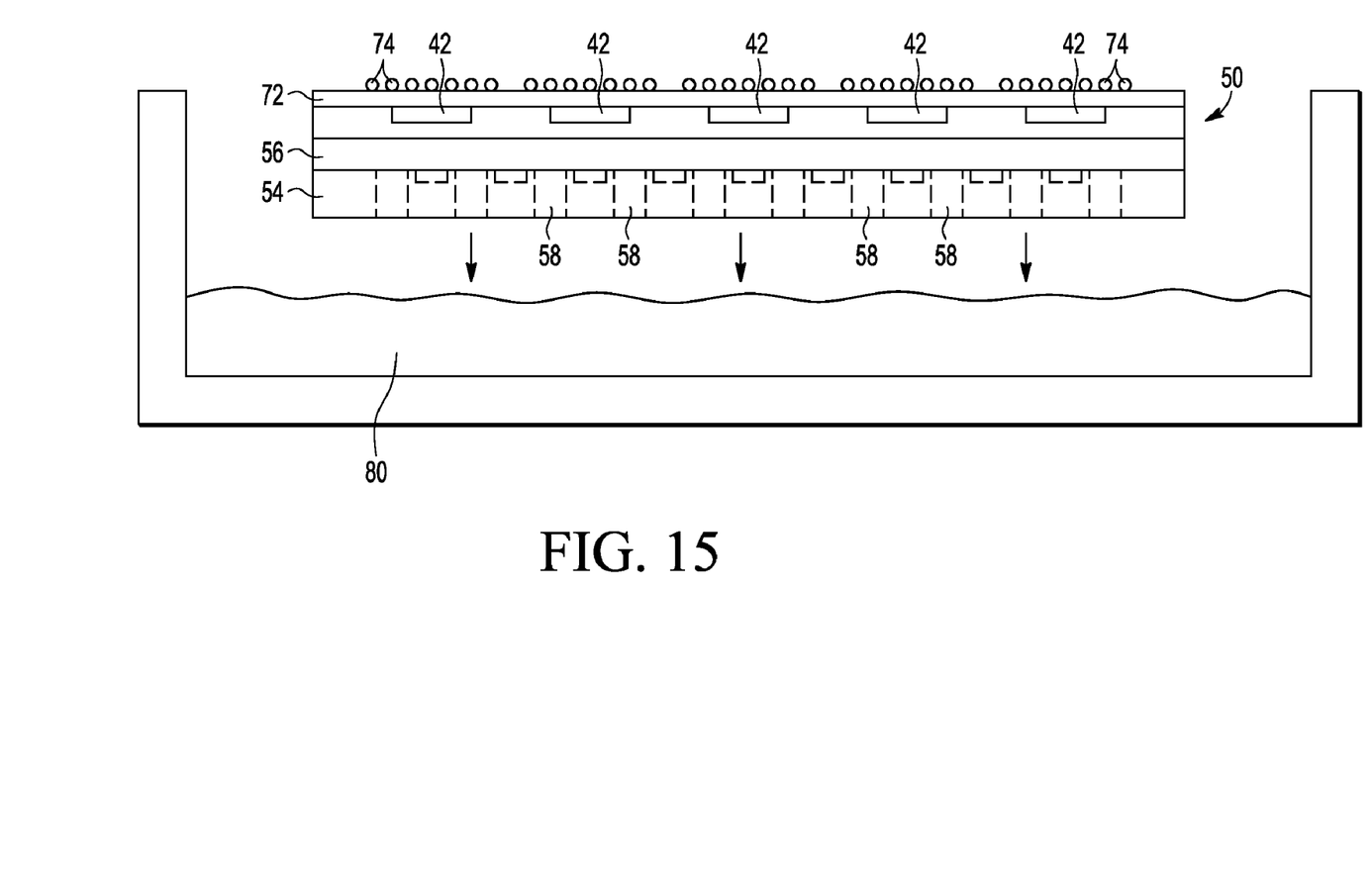
FIG. 15 is a cross-sectional side view of the carrier substrate of FIG. 14 being exposed to a solvent.

Referring to FIG. 15, the carrier substrate 54 is then at least partially submerged in a solvent 80 in which the solvent soluble adhesive of the adhesive layer 56 is soluble (e.g., a solvent containing benzenesulfonic acid). In one embodiment, the carrier substrate 54 is soaked in the solvent 80 for a duration of, for example, between 30 and 120 minutes. Because of the openings 58, the solvent 80 seeps through the carrier substrate 54 to contact the adhesive layer 56 in a substantially even manner. Additionally, because of the gaps formed by the depressions 64, the rate at which the adhesion strength of the adhesive decays is increased due to the reduced contact area between the adhesive and the carrier substrate 54. This effect may also be the result of the solvent 80 entering and quickly dispersing through the gaps formed by the depressions 64 and contacting unexposed adhesive.

Figure 16:
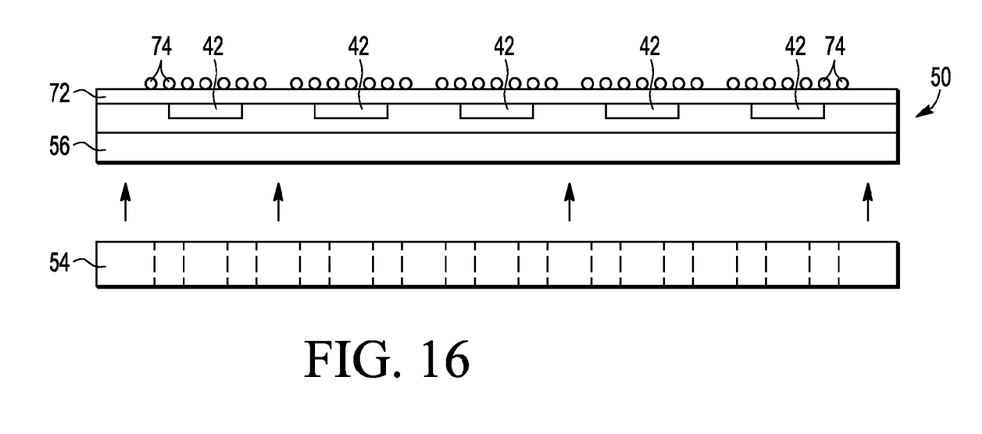
FIG. 16 is a cross-sectional side view of the carrier substrate of FIG. 15 illustrating the device panel being removed therefrom.
Figure 17:
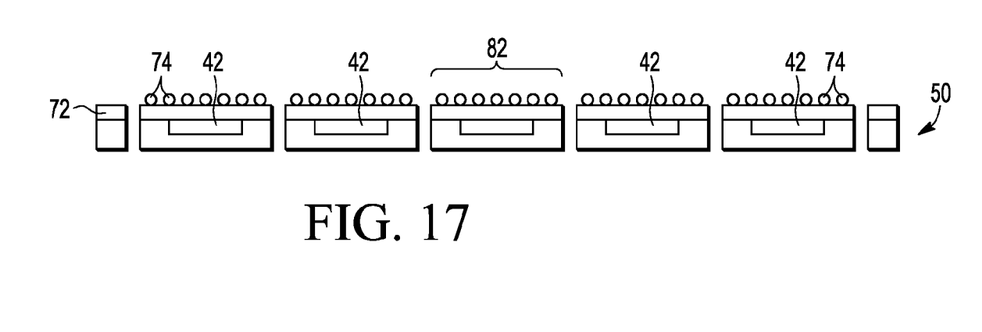
FIG. 17 is a cross-sectional side view of the device panel of FIG. 16 after undergoing a sawing process to separate the device panel into individual integrated circuit packages.
Figure 18:
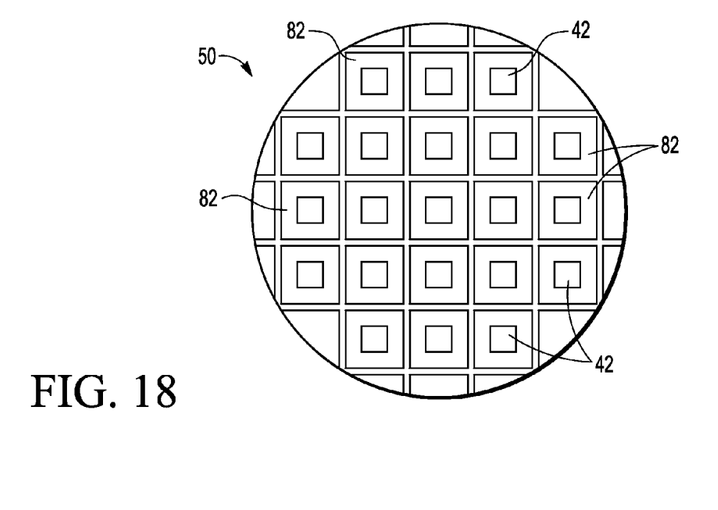
FIG. 18 is a plan view of the device panel of FIG. 17.

As shown in FIG. 16, the carrier substrate 54 and the device panel 50 are then removed from the solvent 80, and the device panel 50 is removed from the carrier substrate 54. Referring to FIGS. 17, 18, and 19, after the remaining portion of the adhesive layer 56 is removed, the device panel 50 is separated (e.g., via a diamond saw) into individual packages (or microelectronic assemblies or device panel portions) 82, each of which includes a respective one of the microelectronic die 42. The packages 82 are, in one embodiment, substantially square with side lengths (or portion widths) 84 of, for example, between 3 and 35 mm. As is apparent in FIGS. 17-19, the side lengths 84 are greater than the die widths 44 (FIG. 5). After final processing steps, the packages 82 may be installed in various computing systems.

One advantage of the methods described above is that, because of the gaps formed between the depressions and the adhesive material, the contact area between the carrier substrate and the adhesive material is reduced. As a result, the time required to sufficiently dissolve the adhesive so that the device panel may be removed from the carrier substrate is reduced. Additionally, because the depth of the depressions is only a small fraction of the thickness of the carrier substrate the strength of the carrier substrate is not adversely affected. As a result, the likelihood of damaging the carrier substrate and/or the device panel during manufacturing is reduced, thus overall manufacturing costs are decreased.

Figure 20:
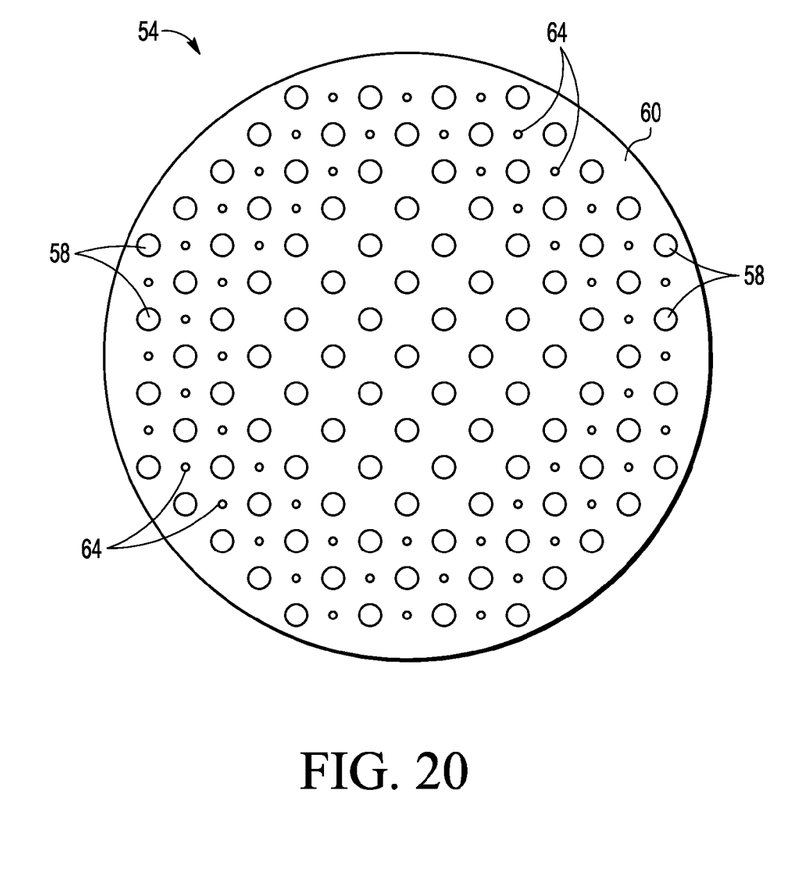
FIGS. 20-23 are plan views of carrier substrates according to alternative embodiments of the present invention.
Figure 21:
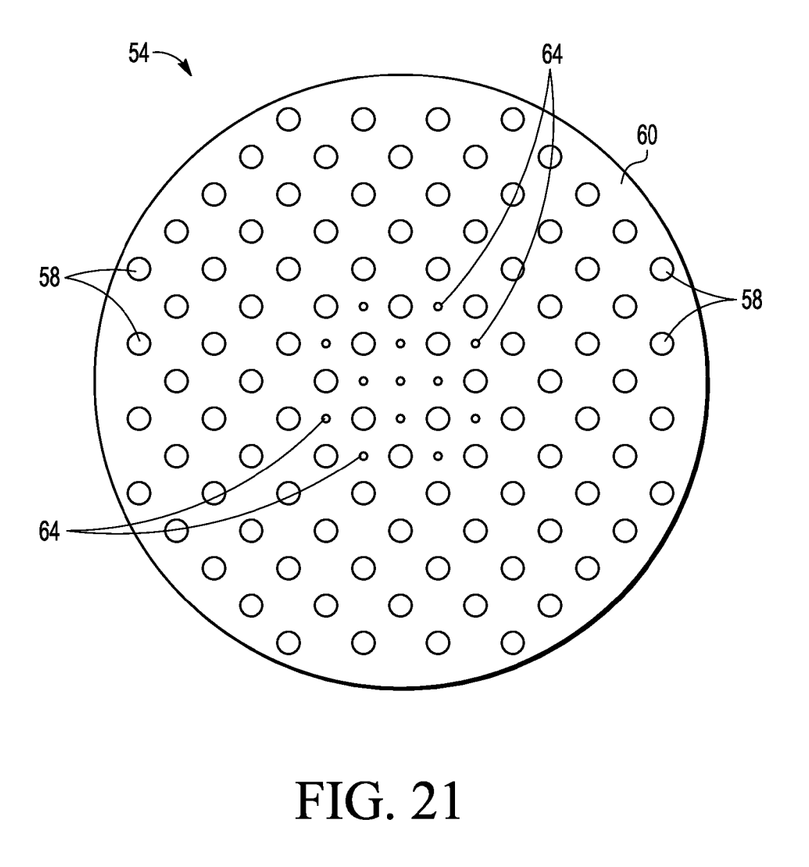
Figure 22:
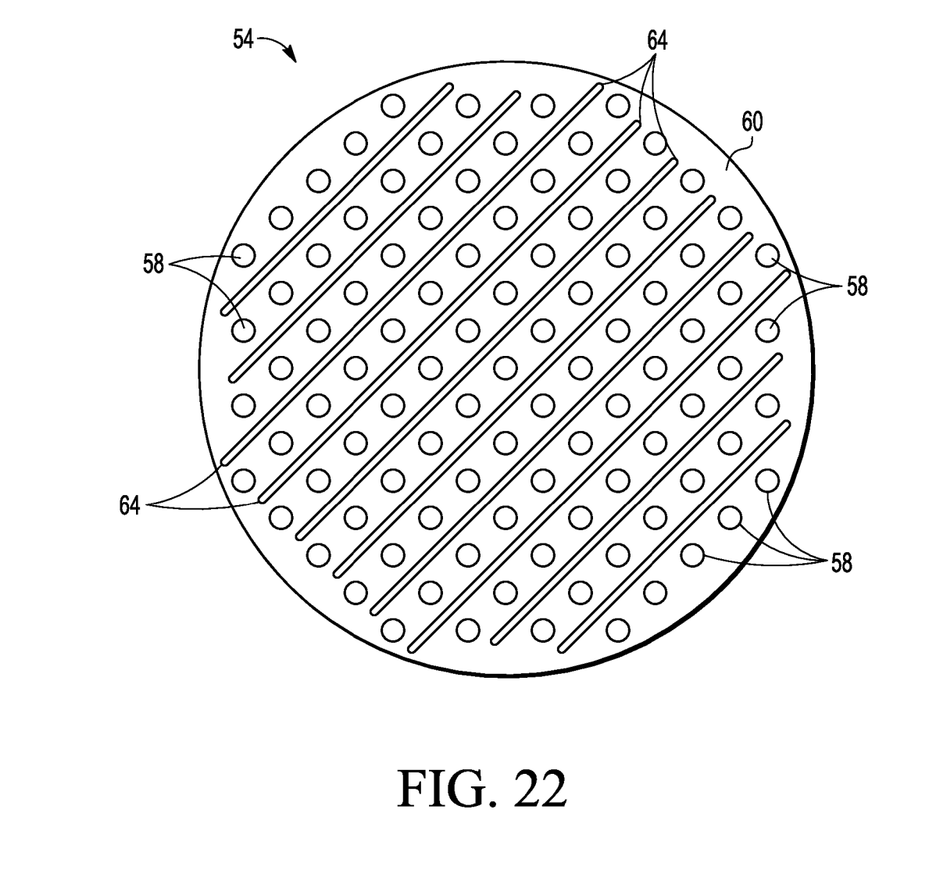
Figure 23:
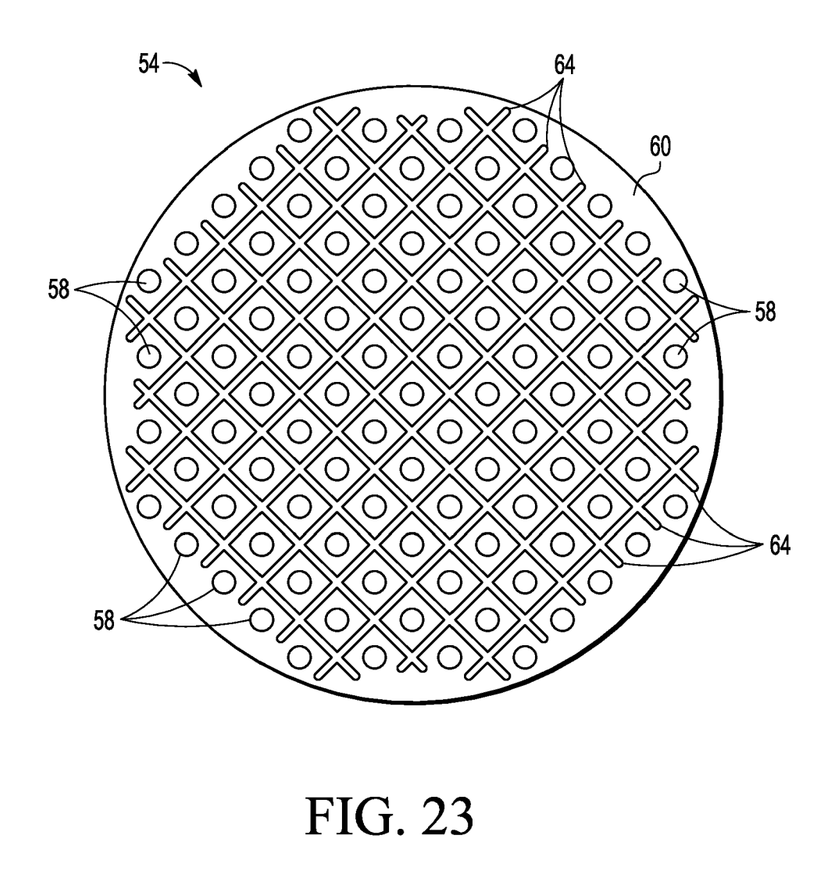

FIGS. 20-23 illustrate various alternative embodiments of the carrier substrate 54, in accordance with other aspects of the present invention. In the embodiment shown in FIG. 20, the carrier substrate (and/or the main body thereof) 54 includes the openings 58 similar to those described above, but the depressions 64 are formed only on an outer portion of the upper surface 60 of the carrier substrate 54, and not the inner portion of the upper surface 60. In the embodiment shown in FIG. 21, the depressions 64 are only formed on the inner portion of the upper surface 60, and not the outer portion of the upper surface 60. A further advantage of the embodiments shown in FIGS. 20 and 21 is that by selectively positioning the depressions 64, the relative speed at which particular portions of the adhesive layer 56 are dissolved may be controlled. In the embodiments shown in FIGS. 22 and 23, the depressions 64 are elongated and extend across the upper surface 60, with that shown in FIG. 23 having two perpendicular sets of depressions 64. That is, in such embodiments the depressions 64 have lengths that are greater than the widths thereof, and greater than the widths of the openings 58. It should be noted that in the embodiment shown in FIG. 23 the depressions 64 may be interconnected such that, in effect, one depression is formed with a "waffle" shape. A further advantage of the embodiments shown in FIGS. 22 and 23 is that the elongated depressions may be used to increase the rate at which the entire adhesive layer 56 is dissolved, as the depressions may serve as channels to quickly disperse the solvent across the adhesive layer 56.

In one embodiment, a method for forming a microelectronic assembly is provided. A device substrate having a plurality of electronic components coupled thereto is provided. A carrier substrate having first and second opposing surfaces and comprising a plurality of openings extending between the first and second opposing surfaces and a plurality of depressions formed on the first opposing surface is provided. The device substrate is attached to the first opposing surface of the carrier substrate using an adhesive material such that at least some of the adhesive material is adjacent to at least some of the plurality of depressions.

The method may also include removing the device substrate from the carrier substrate. The adhesive material may be a solvent soluble adhesive, and the removing of the device substrate from the carrier substrate may include exposing the adhesive material to a solvent.

Each of the plurality of depressions may be positioned between at least two of the plurality of openings. A depth of the plurality of depressions may be less than a thickness of the adhesive material and less than a thickness of the carrier substrate.

The method may also include forming a plurality of insulating layers and conductors over the device substrate while the device substrate is attached to the carrier substrate with the adhesive material. Each of the plurality of electronic components may include a microelectronic die having an integrated circuit formed thereon.

The device substrate may also include an encapsulation material, and the microelectronic die of the plurality of electronic components may be embedded within the encapsulation material. Each of the plurality of depressions may have a width that is less than a width of the plurality of openings. Each of the plurality of depressions may have a width and a length, and the length of the plurality of depressions may be greater than a width of the plurality of openings.

In another embodiment, a method for forming microelectronic assemblies is provided. A plurality of microelectronic die are encapsulated in an encapsulation material to form a device panel. Each of the plurality of microelectronic die has an integrated circuit formed thereon. A carrier substrate having first and second opposing surfaces and including a plurality of openings extending between the first and second opposing surfaces and a plurality of depressions formed on the first opposing surface is provided. The device panel is attached to the first opposing surface of the carrier substrate using a solvent soluble adhesive such that at least some of the adhesive is adjacent to at least some of the plurality of depressions. A plurality of insulating layers and conductors are formed over the device panel while the device panel is attached to the carrier substrate with the solvent soluble adhesive. The device substrate is removed from the carrier substrate. The removing of the device substrate may include exposing the solvent soluble adhesive to a solvent. At least some of the solvent passes through the plurality of openings in the carrier substrate.

The method may also include separating the device panel into a plurality of device panel portions. Each of the device panel portions comprising a respective one of the plurality of microelectronic die.

Each of the plurality of depressions may be positioned between at least two of the plurality of openings, and a depth of the plurality of depressions may be less than a thickness of the adhesive and less than a thickness of the carrier substrate. Each of the plurality of depressions may have a width that is less than a width of the plurality of openings. Each of the plurality of depressions may have width and a length, and the length of the plurality of depressions may be greater than a width of the plurality of openings.

The first surface of the carrier substrate may include inner and outer portions. The plurality of depression may only be on one of the inner and outer portions of the first opposing surface of the carrier substrate.

In a further embodiment, a carrier substrate for forming microelectronic assemblies is provided. The carrier substrate includes a main body having first and second opposing surfaces, a plurality of openings extending through the main body between the first and second opposing surfaces, and a plurality of depressions formed on the first opposing surface.

Each of the plurality of depressions may be positioned between at least two of the plurality of openings. Each of the plurality of depressions may have a width that is less than a width of the plurality of openings.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming a microelectronic assembly comprising:
   providing a device substrate having a plurality of electronic components coupled thereto;
   providing a carrier substrate having first and second opposing surfaces and comprising a plurality of openings extending between the first and second opposing surfaces and a plurality of depressions formed on the first opposing surface;
   attaching the device substrate to the first opposing surface of the carrier substrate using an adhesive material such that at least some of the adhesive material is adjacent to at least some of the plurality of depressions; and
   removing the device substrate from the carrier substrate.

2. The method of claim 1, wherein the adhesive material is a solvent soluble adhesive and the removing of the device substrate from the carrier substrate comprises exposing the adhesive material to a solvent.

3. The method of claim 2, wherein each of the plurality of depressions is positioned between at least two of the plurality of openings.

4. The method of claim 3, wherein a depth of the plurality of depressions is less than a thickness of the adhesive material and less than a thickness of the carrier substrate.

5. The method of claim 4, further comprising forming a plurality of insulating layers and conductors over the device substrate while the device substrate is attached to the carrier substrate with the adhesive material.

6. The method of claim 5, wherein each of the plurality of electronic components comprises a microelectronic die having an integrated circuit formed thereon.

7. The method of claim 6, wherein the device substrate further comprises an encapsulation material and the microelectronic die of the plurality of electronic components are embedded within the encapsulation material.

8. The method of claim 7, wherein each of the plurality of depressions has a width that is less than a width of the plurality of openings.

9. The method of claim 7, wherein each of the plurality of depressions has a width and a length, and the length of the plurality of depressions is greater than a width of the plurality of openings.

10. A method for forming microelectronic assemblies comprising:
    providing a device substrate having a plurality of electronic components coupled thereto;
    providing a carrier substrate having first and second opposing surfaces and comprising a plurality of openings extending between the first and second opposing surfaces and a plurality of depressions formed on the first opposing surface;
    attaching the device substrate to the first opposing surface of the carrier substrate using a solvent soluble adhesive such that at least some of the adhesive is adjacent to at least some of the plurality of depressions;

forming a plurality of insulating layers and conductors over the device substrate while the device substrate is attached to the carrier substrate with the solvent soluble adhesive; and removing the device substrate from the carrier substrate, the removing comprising exposing the solvent soluble adhesive to a solvent, wherein at least some of the solvent passes through the plurality of openings in the carrier substrate.

11. The method of claim 10, wherein each of the plurality of electronic components comprises a microelectronic die having an integrated circuit formed thereon.

12. The method of claim 11, wherein the device substrate further comprises an encapsulation material and the microelectronic die of the plurality of electronic components are embedded within the encapsulation material.

13. The method of claim 12, further comprising separating the device substrate into a plurality of individual packages, each of the individual packages comprising a respective one of the plurality of microelectronic die.

14. The method of claim 10, wherein each of the plurality of depressions is positioned between at least two of the plurality of openings and a depth of the plurality of depressions is less than a thickness of the adhesive and less than a thickness of the carrier substrate.

15. The method of claim 10, wherein each of the plurality of depressions has a width that is less than a width of the plurality of openings.

16. The method of claim 10, wherein each of the plurality of depressions has width and a length, and wherein the length is greater than a width.

17. The method of claim 10, wherein the first opposing surface of the carrier substrate comprises inner and outer portions.

18. The method of claim 17, wherein the plurality of depression are on only one of the inner and outer portions of the first opposing surface of the carrier substrate.

* * * * *